(12) United States Patent
Morrison et al.

(10) Patent No.: US 11,923,258 B2
(45) Date of Patent: Mar. 5, 2024

(54) SEMICONDUCTOR DEVICE PACKAGE WITH DIE CAVITY SUBSTRATE

(71) Applicant: Texas Instruments Incorporated, Dallas, TX (US)

(72) Inventors: William Robert Morrison, Dallas, TX (US); Bradley Morgan Haskett, Allen, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 136 days.

(21) Appl. No.: 17/469,480

(22) Filed: Sep. 8, 2021

(65) Prior Publication Data

US 2022/0189836 A1    Jun. 16, 2022

Related U.S. Application Data

(60) Provisional application No. 63/123,520, filed on Dec. 10, 2020.

(51) Int. Cl.
| | |
|---|---|
| *H01L 23/13* | (2006.01) |
| *H01L 23/00* | (2006.01) |
| *H01L 23/08* | (2006.01) |
| *H01L 23/31* | (2006.01) |

(52) U.S. Cl.
CPC .............. *H01L 23/13* (2013.01); *H01L 23/08* (2013.01); *H01L 23/3121* (2013.01); *H01L 24/45* (2013.01); *H01L 24/48* (2013.01); *H01L 2224/45124* (2013.01); *H01L 2224/45139* (2013.01); *H01L 2224/45144* (2013.01); *H01L 2224/45147* (2013.01); *H01L 2224/45664* (2013.01); *H01L 2224/48227* (2013.01)

(58) Field of Classification Search
CPC .................................................. H01L 23/3121
See application file for complete search history.

(56) References Cited

U.S. PATENT DOCUMENTS

2014/0233086 A1* 8/2014 Oberst .................... B81B 7/007
359/291

OTHER PUBLICATIONS

"DLP6500 0.65 1080p MVSP S600 DMD", Datasheet, No. DLPS053B, Texas Instruments Incorporated, 2016; retrieved from the uniform resource locator (url): https://www.ti.com/lit/ds/dlps053b/dlps053b.pdf?ts=1631067532195&ref_url=https%253A%252F%252Fwww.google.com%252F on Sep. 8, 2021.

* cited by examiner

*Primary Examiner* — Yu-Hsi D Sun
(74) *Attorney, Agent, or Firm* — Michelle F. Murray; Frank D. Cimino

(57) ABSTRACT

An example includes: a substrate having a first package surface, having a second package surface opposite the first package surface, and having a die cavity with a depth extending into the first package surface; a semiconductor die having bond pads on a first die surface and having a second die surface opposite the first die surface, the semiconductor die having a die thickness, the second die surface of the semiconductor die mounted in the die cavity; a cover over a portion of the first die surface; conductors coupling the bond pads of the semiconductor die to bond fingers on the first package surface of the substrate; and dielectric material over the conductors, the bond fingers, the bond pads, at least a portion of the first semiconductor die and at least a portion of the cover, wherein the dielectric material extends above the first package surface of the substrate.

20 Claims, 12 Drawing Sheets

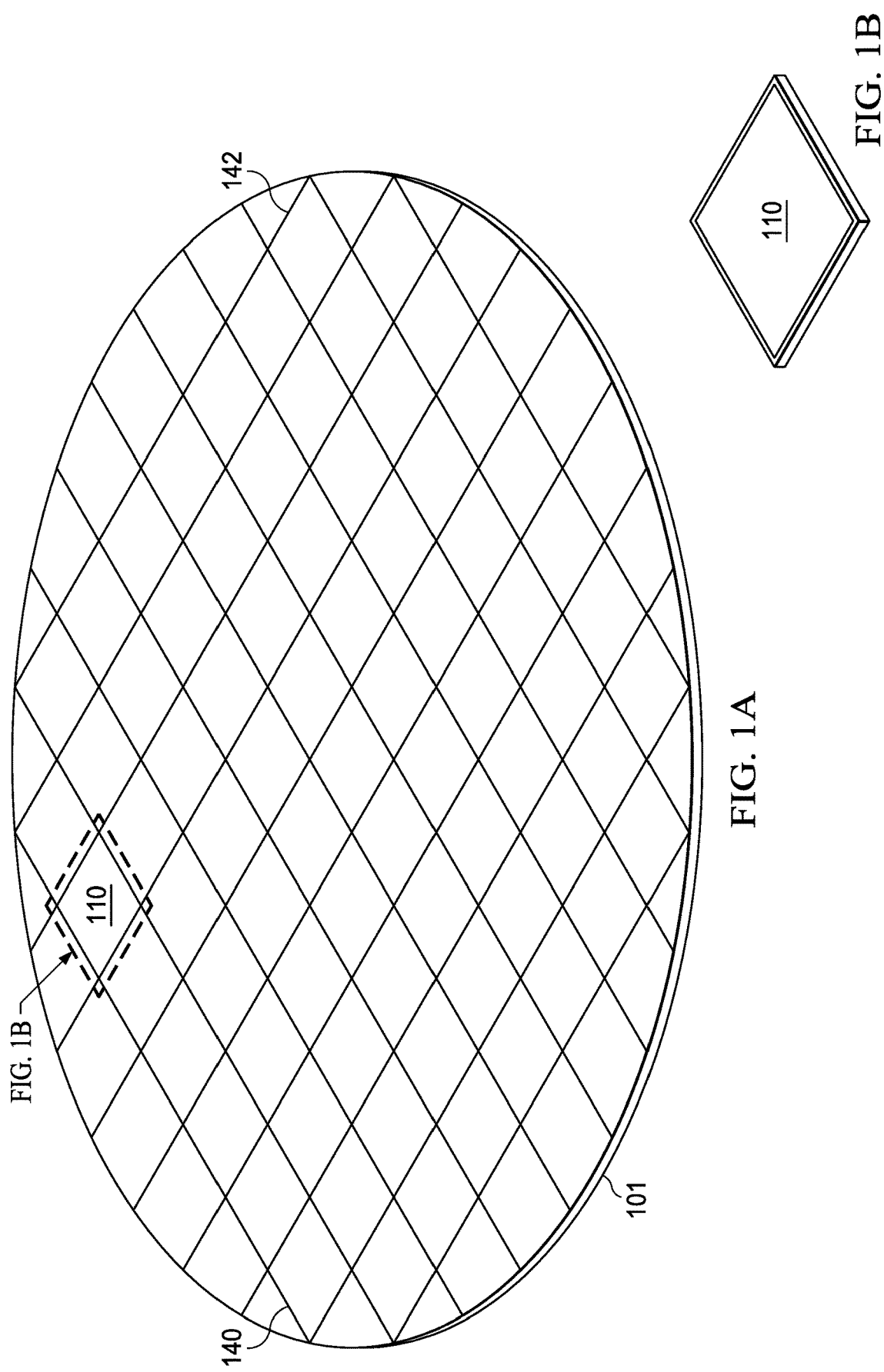

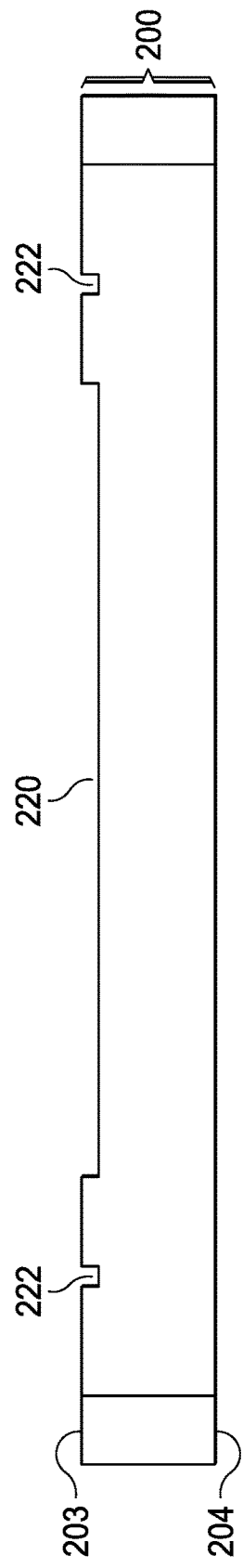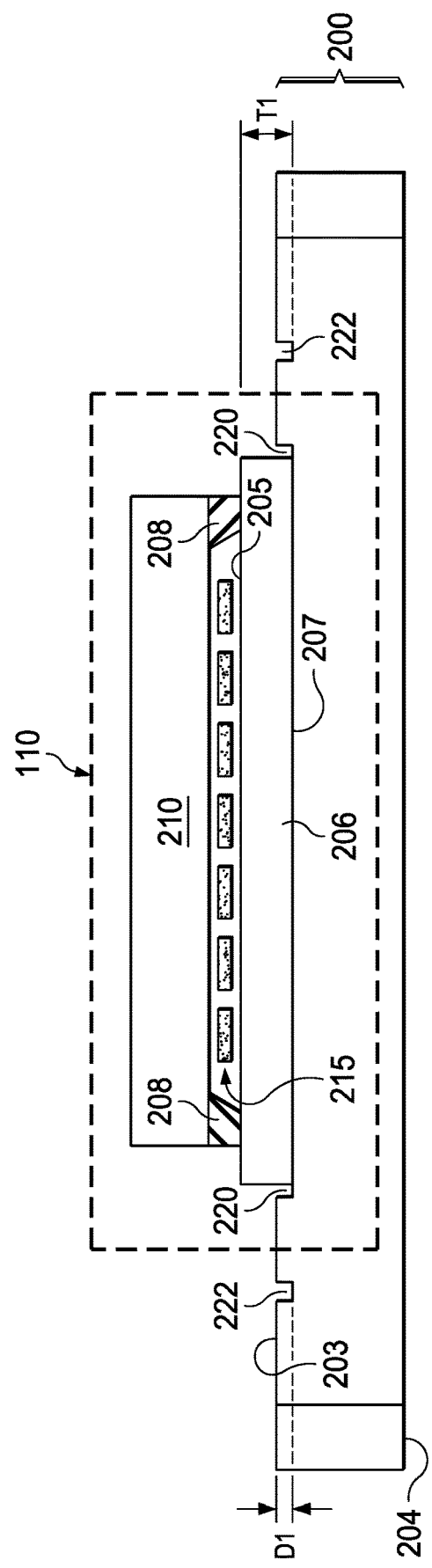

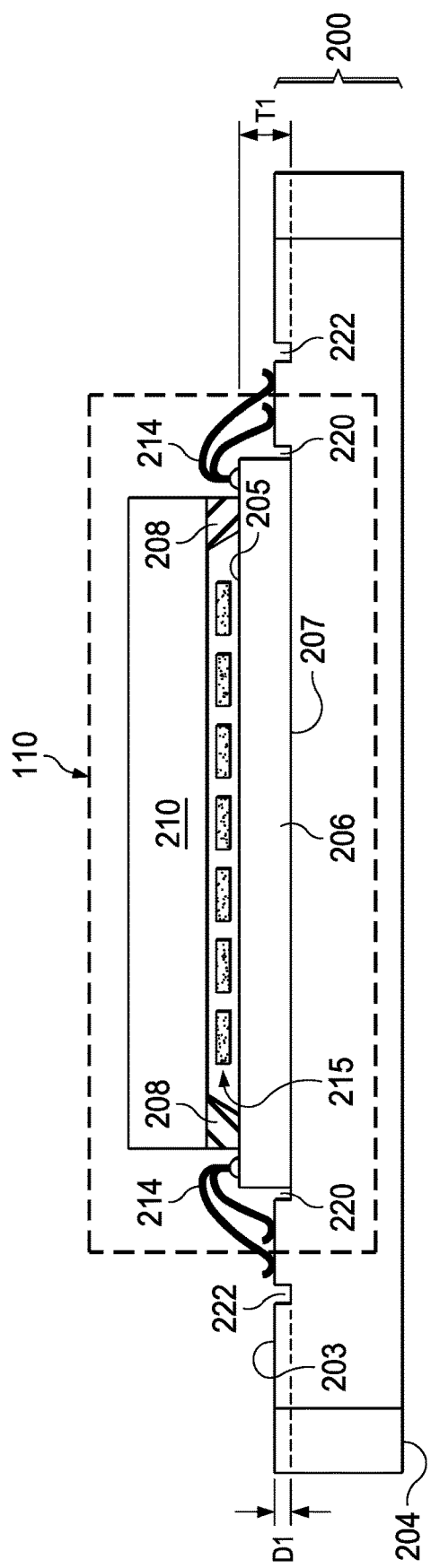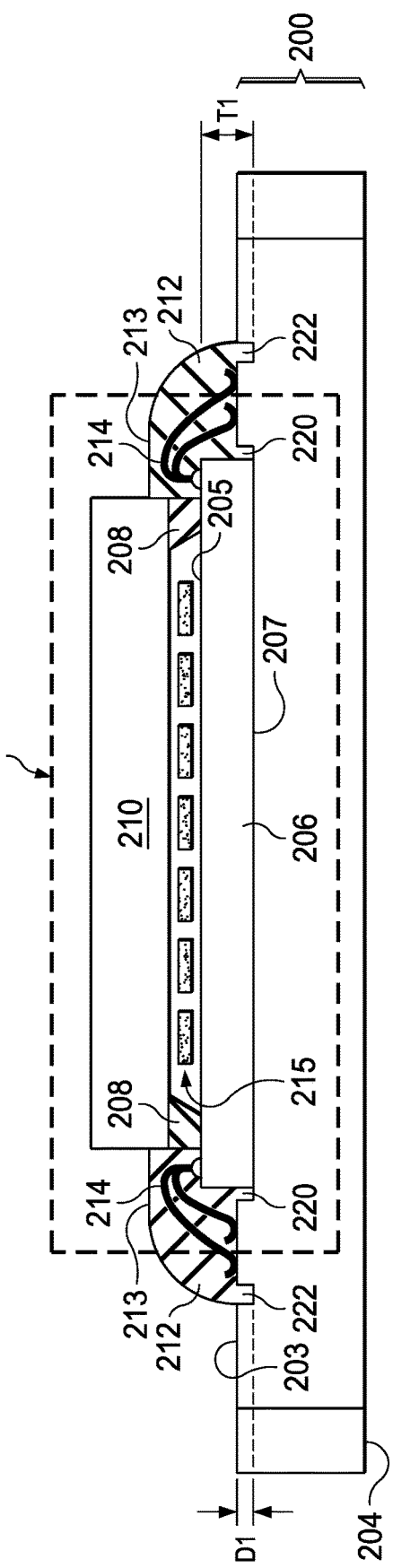

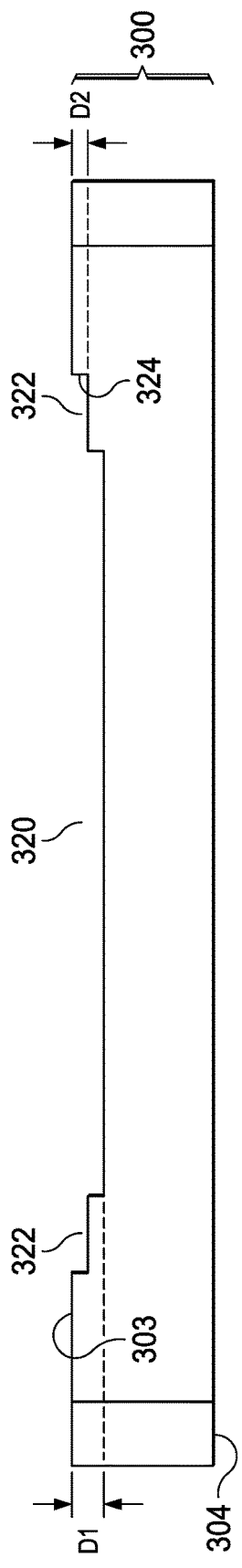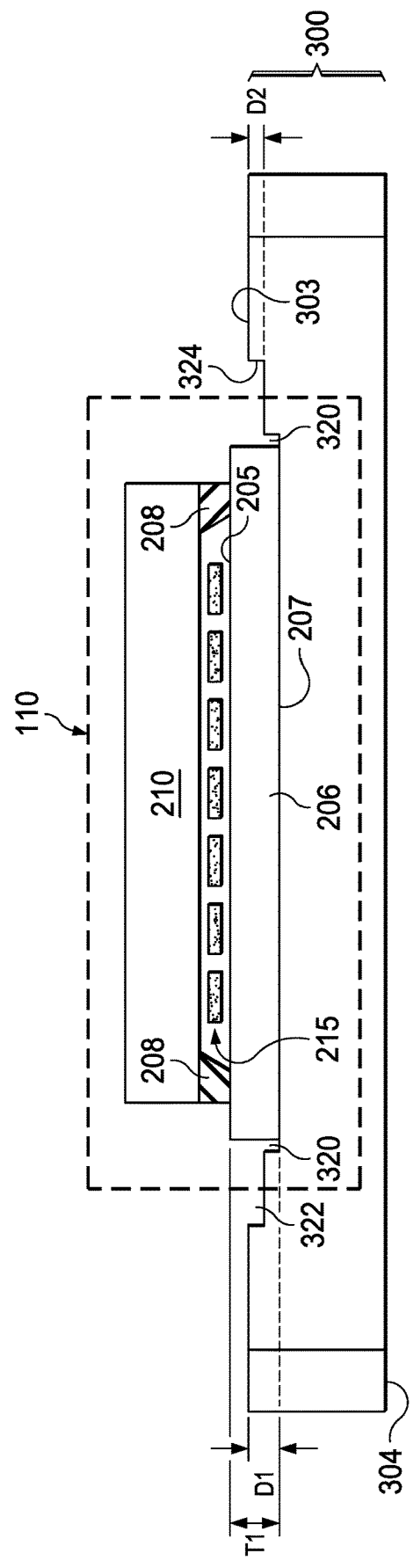

SEMICONDUCTOR DEVICE PACKAGE WITH DIE CAVITY SUBSTRATE

CROSS-REFERENCE TO RELATED APPLICATIONS

This application claims the benefit of and priority to U.S. Provisional Application No. 63/123,520, filed Dec. 10, 2020, which is hereby incorporated herein by reference in its entirety.

TECHNICAL FIELD

This relates generally to packaging electronic devices, and more particularly to a semiconductor device package with a die cavity substrate.

BACKGROUND

Semiconductor devices are packaged with conductors connecting bond pads at the periphery of a semiconductor die to conductive bond fingers on a package substrate. A dielectric material, such as mold compound, a dielectric material referred to as glob top mold compound, or another dielectric material, covers the electrical connections and the bond pads of the semiconductor device, while a portion of the semiconductor device is free from the mold compound.

SUMMARY

An example includes a substrate having a first package surface, having a second package surface opposite the first package surface, and having a die cavity with a depth extending into the first package surface. A semiconductor die having bond pads on a first die surface and having a second die surface opposite the first die surface is mounted in the die cavity with the second die surface in the die cavity, the semiconductor die having a die thickness. A cover is over a portion of the first die surface. Conductors couple the bond pads of the semiconductor die to bond fingers on the first package surface of the substrate; and dielectric material is over the conductors, the bond fingers, the bond pads, at least a portion of the first semiconductor die and at least a portion of the cover, wherein the dielectric material extends above the first package surface of the substrate.

BRIEF DESCRIPTION OF THE DRAWINGS

For a more complete understanding of the illustrative examples of aspects of the present application that are described herein and the advantages thereof, reference is now made to the following descriptions taken in conjunction with the accompanying drawings, in which:

FIG. 1A illustrates in a projection view a semiconductor wafer with semiconductor devices formed on an active surface, while FIG. 1B illustrates a single semiconductor device after a singulation process removes it from the semiconductor wafer.

FIGS. 2A-2D illustrate in a series of cross sections selected steps for forming a packaged semiconductor device of an arrangement.

FIGS. 3A-3D illustrate in a series of cross sections selected steps for forming a packaged semiconductor device of an alternative arrangement.

Corresponding numerals and symbols in the different figures generally refer to corresponding parts unless otherwise indicated. The figures are drawn to clearly illustrate the relevant aspects of the illustrative example arrangements and are not necessarily drawn to scale.

DETAILED DESCRIPTION

Figure 3C:
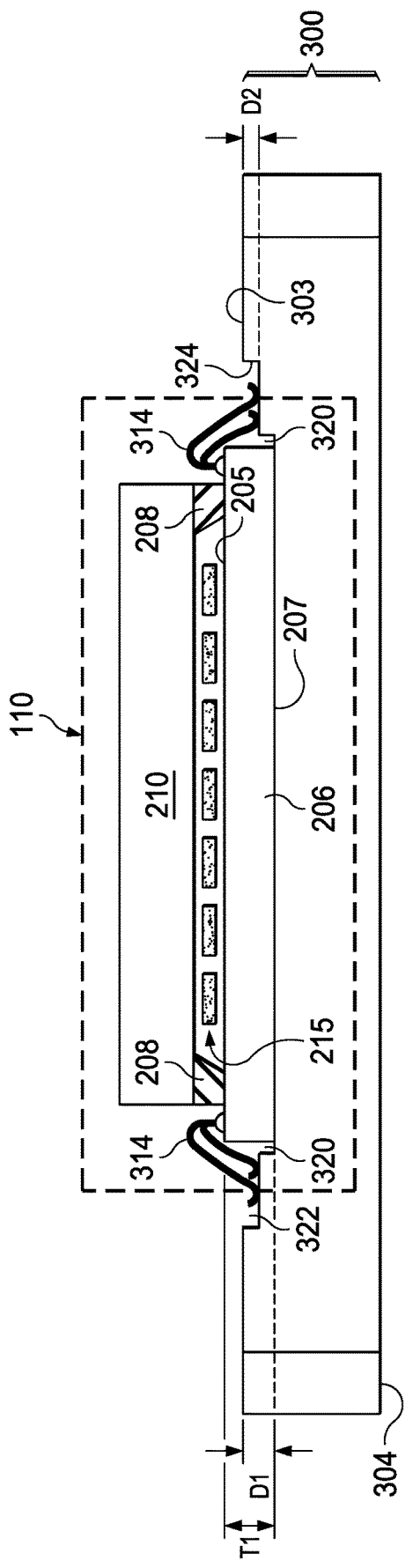

The making and using of example arrangements that incorporate aspects of the present application are discussed in detail below. It should be appreciated, however, that the examples disclosed provide many applicable inventive concepts that can be embodied in a wide variety of specific contexts. The specific examples and arrangements discussed are illustrative of specific ways to make and use the various arrangements, and the examples described do not limit either the scope of the specification, or the scope of the appended claims.

For example, when the term "coupled" is used herein to describe the relationships between elements, the term as used in the specification and the appended claims is to be interpreted broadly, and is not limited to connected or directly connected but instead the term "coupled" may include connections made with intervening elements, and additional elements and various connections may be used between any elements that are coupled. The term "optically coupled" is used herein. Elements that are "optically coupled" have an optical connection between the elements but various intervening elements can be between elements that are optically coupled.

The term "package substrate" is used herein. A package substrate is a support having a surface suitable for mounting a semiconductor device. In the arrangements, useful package substrates can include: ceramic substrates, including multiple layer ceramic substrates with conductors in layers coupled by vertical conductive vias, glass reinforced laminate substrates such as flame-retardant 4 (FR4) substrates which can include multiple layers and conductors in multiple layers coupled by vertical vias, laminate substrates with multiple layers of conductors and insulator layers; printed circuit board substrates of ceramic, plastic, fiberglass or resin; lead frames of copper, copper alloys, stainless steel or other conductive metals (such as Alloy 42); molded interconnect substrates (MIS); pre-molded lead frames (PMLFs) with lead frame conductors and dielectric material in a preformed structure; and tape based and film-based substrates carrying conductors. Lead frames that are half-etched or partially etched to form portions of different thicknesses, or to form openings in metal layers, can be used.

The term "semiconductor die" is used herein. As used herein, a semiconductor die can be a discrete semiconductor device such as a bipolar transistor, a few discrete devices such as a pair of power field effect transistor (FET) switches fabricated together on a single semiconductor die, or a semiconductor die can be an integrated circuit with multiple semiconductor devices such as the multiple capacitors in an analog-to-digital (A/D) converter. The semiconductor die can include passive devices such as resistors, inductors, filters, or can include active devices such as transistors. The semiconductor die can be an integrated circuit with hundreds or thousands of transistors coupled to form a functional circuit, for example a microprocessor or memory device. The semiconductor die can be a passive device such as a sensor, example sensors include photocells, transducers, and charge coupled devices (CCDs). The semiconductor die can be a micro electro-mechanical system (MEMS) device, such as a digital micromirror device (DMD). The semiconductor die can be an optical receiver or transmitter, an optical sensor, an optical imager, or a mirror, and can be a spatial light modulator (SLM) such as a liquid crystal on semiconductor (LCOS) device or a DMD device. The SLM can be an amplitude SLM device or a phase SLM device.

The term "packaged semiconductor device" is used herein. A packaged semiconductor device has at least one semiconductor die electronically coupled to terminals and has package components that protects and covers the semiconductor die. In some arrangements, multiple semiconductor dies can be packaged together. For example, a first semiconductor die can have a second semiconductor die stacked over it to form a single packaged semiconductor device. Additional components such as passives can be included in the packaged semiconductor device. A semiconductor die is mounted to a package substrate that provides conductive leads, a portion of the conductive leads form the terminals for the packaged semiconductor device. The semiconductor die can be mounted to the package substrate with an active device surface facing away from the package substrate and a backside surface facing and mounted to the package substrate. The packaged semiconductor device can have a package body formed by a thermoset epoxy resin in a molding process, or by the use of epoxies, plastics, or resins that are liquid at room temperature and are subsequently cured. The package may provide a hermetic package for the packaged semiconductor device. In example arrangements, an optically transmissive cover, or window, is mounted over a portion of the semiconductor die to allow light to enter and exit the packaged semiconductor device, a dielectric material covers a portion of the semiconductor die, a portion of a package substrate and electrical connections between the semiconductor die and a package substrate, while a surface of the cover remains exposed from the dielectric material.

In example arrangements, an apparatus, which is a packaged semiconductor device, is formed including a semiconductor die having an active surface and an opposite backside surface. The semiconductor die is mounted on a first substrate, which is a package substrate, having a die cavity. The die cavity is a recess in a first package surface of the first substrate that is configured to receive the semiconductor die and having a depth. The backside surface of the semiconductor die is mounted in the die cavity. Conductors are connected between bond pads on the active surface of the semiconductor die and conductive bond fingers on the first package surface of the first substrate. In examples, the conductors are bond wires or ribbon bonds. A dielectric material is dispensed to cover the electrical connections, the bond pads on the semiconductor die and the bond fingers on the package substrate. The dielectric material is cured, and the cured dielectric material has an upper surface that extends above an upper surface of the first package surface of the first substrate. In some examples, the semiconductor die has a thickness greater than the depth of the die cavity, so that an upper surface of the semiconductor die is above the first package surface of the first substrate. In alternative arrangements, the semiconductor die has a thickness that is equal to, or less than, the depth of the die cavity. In the arrangements, features on the first package surface of the first substrate contain the dielectric material in a designated area of the first package surface when the dielectric material is dispensed. In one example, trenches are formed on the first package surface of the first substrate surrounding the bond fingers and adjacent to and spaced from ends of the die cavity. The trenches contain the dielectric material when the dielectric material is dispensed. In an additional arrangement, a bond finger shelf is formed in a second cavity extending into the first package surface of the first substrate and surrounding the die cavity or portions of the die cavity. The second cavity has a depth less than the depth of the die cavity. The bond fingers are located within the bond finger shelf on the bottom surface of the second cavity. The dielectric material is dispensed into the second cavity and contained by the second cavity. The dielectric material is a liquid or gel when dispensed, the dielectric material subsequently cures and hardens. A cover is mounted over the active surface of the semiconductor die. The first substrate, the semiconductor die, the dielectric material, and the cover form a packaged semiconductor device. Use of the arrangements reduces the amount of dielectric material needed to cover the conductors and reduces mechanical stress between the dielectric material and the semiconductor die, eliminating or reducing delamination defects that might occur without use of the arrangements.

In packaging semiconductor dies with glob top dielectric material covering portions of the semiconductor die and/or conductors connected between the semiconductor dies and a package substrate, a coefficient of thermal expansion (CTE) mismatch between the materials can cause mechanical stress sufficient to cause the electrical connections to fail. Examples include semiconductor devices where light is received or transmitted, such as imagers, photosensors, laser diodes or light emitting diodes (LEDs), optical micro electro-mechanical system (MEMS) devices, and spatial light modulators. A portion of a semiconductor die may be covered with an optically transmissive or transparent cover or window, such as glass. Bond pads used for connecting the semiconductor die are formed on the active surface in end or side portions of the semiconductor die and outside the area of the semiconductor die covered by the cover. In another example in which conductors are connected between bond pads at a periphery of a semiconductor die and a package substrate, while a central portion of the semiconductor die is free from connections, a stacked die arrangement can be formed, where a portion of a first semiconductor die is covered by a second semiconductor die or other component.

In the arrangements, glob top dielectric material is dispensed as a liquid resin or epoxy that is applied to a selected area, and then is cured to form a protective solid dielectric material. The dielectric material can be cured by a thermal cure, an ultraviolet cure, or by a time cure, depending on the composition of the dielectric material used for the glob top. The coefficient of thermal expansion (CTE) for the cured glob top material differs from the CTE for the semiconductor die, the glass cover, for the package substrate and for other materials used in the package. In thermal cycling of the finished packaged semiconductor devices, such as thermal cycling used in device stress testing, delamination can occur between the glob top dielectric material and the other materials, pulling the glob top apart from the semiconductor die and or the cover, and sometimes breaking one or more of the connections to the conductors. In examples, the conductors can be s wire bonds or ribbon bonds. The wire bonds can be pulled from the semiconductor die or from the package substrate, creating failures during thermal cycling.

It is desirable to have packages for semiconductor devices using glob top materials. Low material costs and efficient assembly processes are useful to produce packaged devices at low costs. It is desirable to package multiple devices simultaneously to provide sufficient throughput and device volume, maintaining low cost of the finished devices throughout the assembly process. To be useful in a wide variety of application, the packaged semiconductor devices should be compatible with thermal cycles from −55 to +125 degrees Celsius. Example applications include automotive headlamps, head-up displays, wearable devices, portable optical projectors, and pico-projectors built into smartphones, tablets, and laptops.

FIGS. 1A and 1B illustrate a semiconductor wafer including a plurality of semiconductor devices 110, and a single semiconductor device 110 after it has been removed from the semiconductor wafer in a singulation process, respectively. In a wafer level packaging (WLP), semiconductor dies are formed in a semiconductor fabrication facility, using semiconductor manufacturing process including implantations, anneals, photolithography, dielectric deposition, metal deposition, planarization, and passivation. In wafer level packaging, the semiconductor devices 110 are further processed. For example, for semiconductor dies useful with the arrangements, optical covers can be mounted over the semiconductor dies while the semiconductor dies are still part of the wafer, lowering assembly costs.

In FIG. 1A, a semiconductor wafer 101 is shown with a plurality of wafer level packaging semiconductor devices 110 arranged in rows and columns and spaced from one another by scribe lines 142, shown in a first direction as the semiconductor wafer 101 is oriented in FIG. 1A, and scribe lines 140, shown in a second direction in FIG. 1A that is normal to the first direction. After semiconductor devices 110 including a semiconductor die are manufactured using semiconductor fabrication processes, a wafer level packaging step mounts an interposer and covers to the semiconductor dies while the semiconductor dies are still on the wafer 101, the semiconductor devices 110 then including the semiconductor dies, the interposers, and the covers. The wafer 101 is then singulated into unit semiconductor devices 110 by use of a saw or laser cutting tool to cut the wafer 101 along the scribe lines 140 and 142. FIG. 1B illustrates a single semiconductor device 110 such as can be used in the arrangements. A semiconductor device 110 can be mounted to a package substrate and packaged as is described below.

FIGS. 2A-2D illustrate, in a series of cross sections and selected steps for forming an apparatus of the arrangements. In FIG. 2A, a substrate 200 is shown, in an example the substrate 200 is a ceramic package substrate less than 2 millimeters in thickness. In another example, the substrate 200 is an organic package substrate. Glass fiber epoxy package substrates such as flame-retardant 4 (FR4) can be used, as well as bismaleimide triazine (BT) resin package substrates. Multiple layer substrates, including ceramic substrates and organic substrates, can be used. In a particular example the substrate 200 is a ceramic multi-layer substrate about 1.78 millimeters thick. Other substrate thicknesses can be used, useful substrate thicknesses range from about 1.0-5.0 millimeters, lesser thicknesses can result in lower substrate costs. A die cavity 220 is formed in a first package surface 203 of substrate 200, which has a second package surface 204 opposite the first package surface. The second package surface 204 can be used to make connections to a system board. Trenches 222, which act as mold compound stops or gutters, are formed in the first package surface 203 of package substrate 200. The trenches 222 are spaced from two ends of the die cavity 220 and are adjacent the two ends of the die cavity 220. In an example arrangement, the trenches 222 are parallel to two ends of the die cavity 220. To form the trenches 222 and the die cavity 220 in the first package surface 203 of the substrate, when a multiple layer substrate is used, openings are left in the trench areas and die cavity areas of upper layers when the multiple layer substrate is formed. Alternatively, etching processes, such as laser drilling or chemical etch steps, can be used to form the die cavity 220 and the trenches 222 in the first package surface 203 of the substrate 200.

FIG. 2B illustrates the substrate 200 after a semiconductor device 110 including a semiconductor die 206, an interposer 208, and a cover 210 is mounted to the substrate 200 in the die cavity 220. In one example, the cover 210 is an optically transparent window. In another example, the cover 210 is a semiconductor die. The semiconductor die 206 has an active surface 205 and an opposite backside surface 207, the backside surface 207 is mounted in the die cavity 220. In an example, the semiconductor device 110 is a digital micromirror device (DMD) with micromirrors 215 formed on the active surface 205 of the semiconductor die 206. In the example of FIG. 2B, the depth D1 of the die cavity 220 is shown to be less than the thickness T1 of the semiconductor die 206. In some examples, the depth D1 is between one quarter and one half of the thickness T1 of the semiconductor die 206. In this example, the active surface 205 (as the elements are oriented in FIGS. 2A-2D) of the semiconductor die 206 is above the first package surface 203 of the substrate 200. In alternative arrangements, the depth D1 can be equal to the thickness T1 of the semiconductor die 206, or slightly greater, so that the active surface 205 of the semiconductor die 206 is in the same horizontal plane as, or beneath, the first package surface 203 of the substrate 200. In the illustrated example the semiconductor device 110 is a digital micromirror device (DMD). Micromirrors 215 are coupled to addressable memory cells (not shown for clarity) within the semiconductor die 206. Micromirrors 215 are micro-electro-mechanical system (MEMS) devices that move and tilt mirror surfaces in response to voltages from a corresponding addressable memory cell formed within the semiconductor die 206 (not shown for clarity).

FIG. 2C illustrates the arrangement shown in FIG. 2B after additional processing. Conductors 214 form connections between bond pads (not shown, for clarity) on the active surface 205 of the semiconductor die 206 and bond fingers (not visible in the figures) on the first package surface 203 of the substrate 200. Conductors 214 can be bond wires. In processing, a wire bonder tool forms a free air ball at the end of a bond wire extending through a capillary. The ball is bonded to a bond pad on the semiconductor die 206 using thermal, pressure, and/or sonic energy to make a ball bond to the bond pad. As the capillary tool moves away from the ball bond, the bond wire extends through the capillary and forms arcs or curved wire shapes. The capillary then moves above a conductive bond finger on the package substrate, and makes a stitch bond to the bond finger, this process for wire bonding is referred to a ball and stitch bonding. In the cross section of FIG. 2C, conductors 214, which can be bond wires, are shown. The bond wires can be any used in semiconductor packaging, such as gold, copper, palladium coated copper, silver, or aluminum. Gold and palladium coated copper (PCC) bond wires are often used, although other bond wire types can be used in the arrangements. Alternative arrangements can use ribbon bonds instead of bond wires as conductors 214 that couple the bond pads to the bond fingers of the substrate 200.

FIG. 2D illustrates the semiconductor device 110 and the substrate 200 after additional processing to form a packaged semiconductor device. A dielectric material 212 is dispensed over the conductors 214, which in this illustrated example are bond wires, and the dielectric material 212 contacts the sides of the semiconductor die 206 and a portion of the sides of the cover 210, and extends over the first package surface 203 of the substrate 200 and to the trenches 222. In an example process, the dielectric material 212 is dispensed as a liquid or gel, for example a glob top dielectric material can be used. The dielectric material 212 is cured. Thermal cure, ultraviolet (UV) cure, or time cure can be used to harden the glob top material into a solid. The cure is selected based on the particular glob top dielectric material selected. The die cavity 220 in the first package surface 203 of the substrate 200 reduces the height of the semiconductor die 206 above the first package surface 203 that is covered by the dielectric material 212, reducing the volume of the dielectric material 212 and therefore reducing the CTE stress in the packaged semiconductor device during thermal cycling. In the example illustrated in FIGS. 2A-2D, the die cavity depth D1 is less than the thickness T1 of the semiconductor die. However, in additional alternative arrangements, the die cavity depth D1 can be equal to or greater than the thickness T1 of the semiconductor die 206. In the arrangements the volume of the dielectric material 212 is reduced (when compared to packaged devices formed without the use of the arrangements) and the mechanical stress due to the glob top material is correspondingly reduced. Further, as is described below, a wafer thinning operation can be used to thin the semiconductor die 206 prior to packaging, which results in the top surface of the semiconductor die 206 being at the same plane or below the first package surface 203 of the substrate. The dielectric material 212 has an upper surface 213 that is above the first package surface 203.

FIGS. 3A-3D illustrate, in another series of cross sections, selected steps used to form an apparatus in an alternative arrangement. In FIG. 3A, a substrate 300 is shown in cross section. The substrate 300 is a package substrate with a die cavity 320 extending into a first package surface 303, and bond finger shelf cavities 322 formed extending into the first package surface 303 at two ends of the die cavity 320. In an alternative arrangement the bond finger shelf cavity 322 can surround the die cavity. The die cavity has a depth D1, which is the same as D1 in FIGS. 2A-2D, and the bond finger shelf cavity 322 has a depth D2 that is less than depth D1, for example, D2 can be one half of the depth D1. Bond finger shelf cavity 322 has an outer edge 324 away from the die cavity that acts to contain dielectric material when it is dispensed (shown below in FIG. 3D). The substrate 300 also has a second surface 304 opposite the first surface 303. In an example, the substrate 300 has a thickness of less than about 2 millimeters, the depth D1 is about 0.5 millimeters, and the depth D2 is about 0.25 millimeters, each with a manufacturing tolerance of about +/−0.1 millimeters. Other depths can be used, and other substrate thicknesses can also be used in arrangements. Example substrate thicknesses range from 1 millimeter to about 5 millimeters, and the depth D1 can range from about 0.2 millimeters to 1 millimeter, with the depth D2 ranging from about 0.1 millimeters to about 0.5 millimeters.

FIG. 3B illustrates the substrate 300 of FIG. 3A after additional processing. In FIG. 3B, a semiconductor device 110 that includes a semiconductor die 206, is mounted in the die cavity 320 of the substrate 300. The semiconductor die 206 of semiconductor device 110 has a thickness T1 that is greater than the depth D1. Thickness T1, the semiconductor die thickness, is the same as in FIGS. 2B-2D. Semiconductor die 206 has an active surface 205, and the active surface 205 of the semiconductor die 206 is above the bottom surface of bond finger shelf cavity 322. In the example, semiconductor device 110 is an SLM, and semiconductor die 206 is a digital micromirror device (DMD) with micromirrors 215 over the active surface 205.

FIG. 3C illustrates in a cross section the substrate 300 and the semiconductor device 110 of FIG. 3B after further processing. Conductors 314 connect bond pads (not shown in FIG. 3C for clarity of illustration) on the active surface 205 of semiconductor die 206 and bond fingers (not visible) in bond finger shelf cavity 322. The conductors 314 can be bond wires formed in a wire bonding process. Because the bond finger shelf cavity 322 is beneath the first package surface 303 of the substrate 300, bond wire loop height is lessened and the bond wires form a lower loop than in the arrangement of FIG. 2C, or when compared to a packaged semiconductor device formed without the arrangements.

Figure 3D:
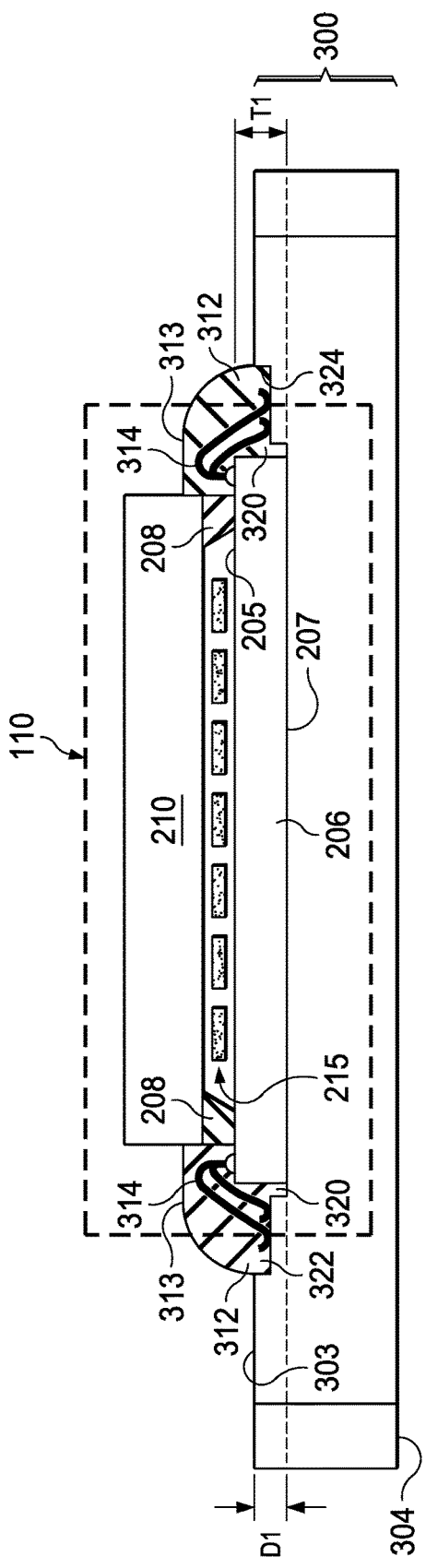

FIG. 3D illustrates in a cross section the substrate 300 and the semiconductor device 110 of FIG. 3C after further processing. In FIG. 3D dielectric material 312 is formed over the conductors 314. The dielectric material 312 is dispensed in liquid or gel form to cover the conductors 314, portions of the substrate 300, portions of the semiconductor die 206, semiconductor device 110, and portions of the sides of the cover 210. The dielectric material 312 is cured to form a solid material over the conductors 314 and extends over the bond finger shelf cavity 322 to edge 324. The dielectric material 312 has an upper surface 313 that is above the first package surface 303. Because the bond finger shelf cavity 322 reduces the height of the bond wires in conductors 314 (when compared to the arrangement in FIG. 2D), the volume of the dielectric material 312 that is needed to cover the conductors 314 is reduced. As a result, use of the arrangements reduces the volume of dielectric material 312 that contacts the semiconductor die 206, and reduces or eliminates delamination during thermal cycling of the packaged semiconductor device of FIG. 3D.

Figure 4A:
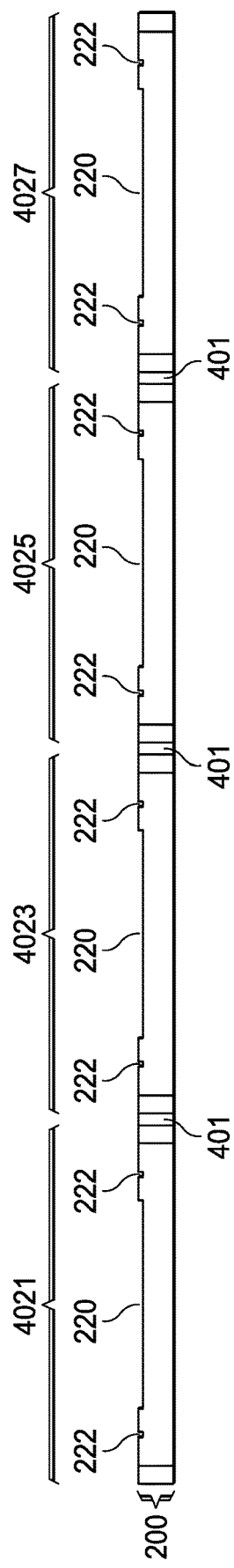
FIGS. 4A-4B illustrate in two cross sections the use of a panel package substrate to form multiple packaged semiconductor devices of an arrangement.
Figure 4B:
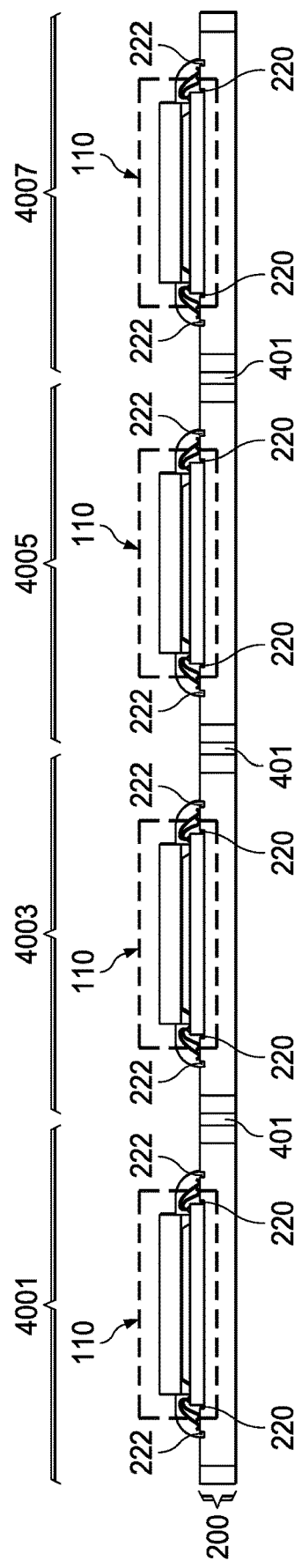

FIGS. 4A and 4B illustrate, in cross sectional views, a panel formed of a package substrate 200. In the cross section in FIG. 4A, individual units 4021, 4023, 4025, 4027 are formed along a row in the cross section, each unit having a die cavity 220 and trenches 222 that are spaced from, adjacent, and parallel to the ends of the die cavities, as shown in FIG. 2A. In the cross section in FIG. 4B, the panel formed of package substrate 200 is shown after the semiconductor devices 110 are mounted on the units and the dielectric material is deposited and cured, forming packaged semiconductor devices 4001, 4003, 4005, and 4007. The unit devices are spaced apart by saw streets 401 of the package substrate 200. The die cavities 220 and the trenches 222 are shown for the unit devices. After the packaged semiconductor devices are complete, the packaged semiconductor devices are separated by sawing through the saw streets 401. In an alternative approach, the packaged semiconductor devices are separated using a scribe lane, and the package substrate panel is singulated by scribing and breaking the package substrate material between the unit devices. By assembling multiple packaged semiconductor devices contemporaneously, production costs are lowered for the completed devices.

Figure 4C:
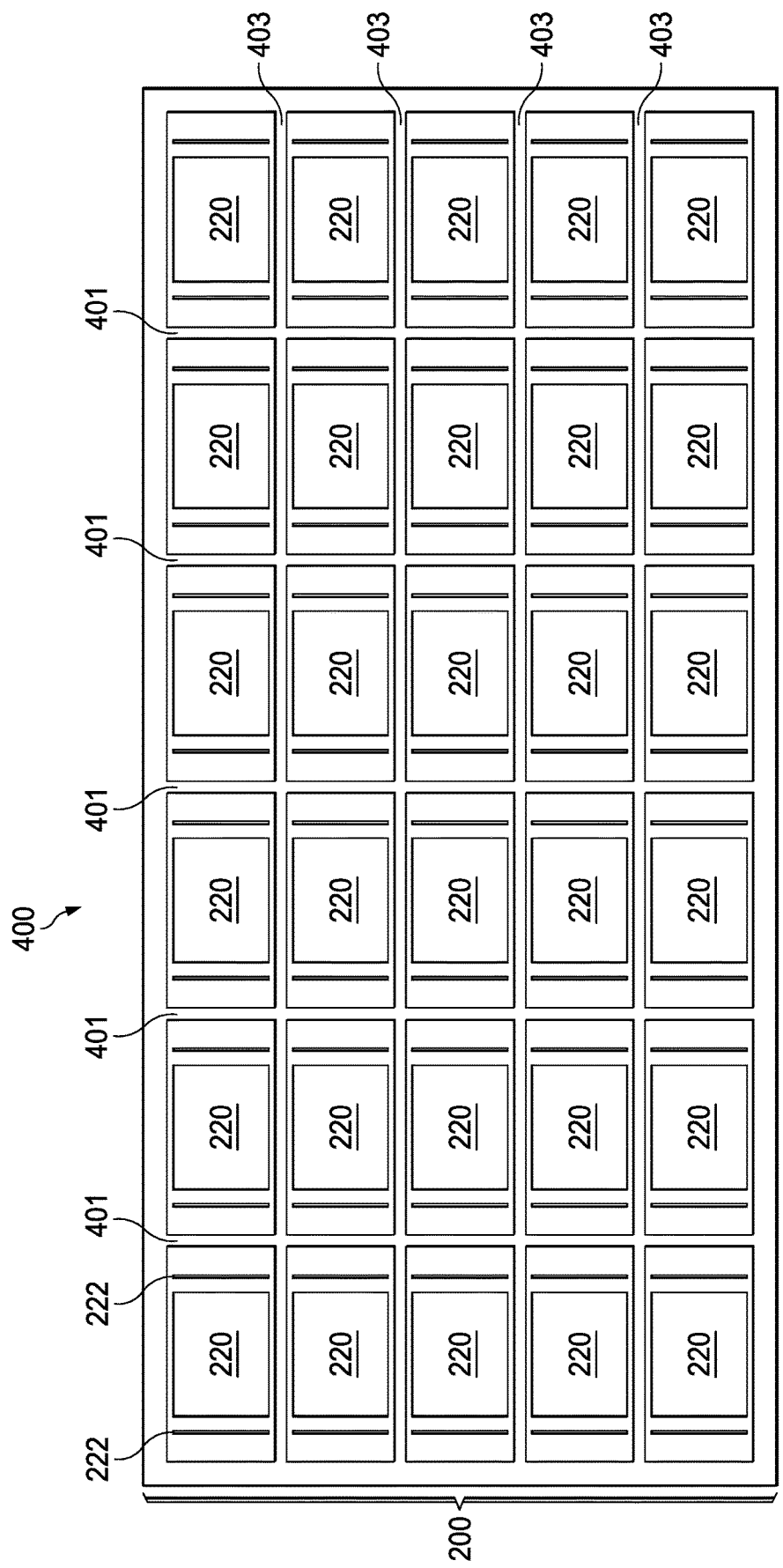
FIG. 4C illustrates in a plan view a panel package substrate with saw streets between units.

FIG. 4C illustrates, in a plan view, a panel 400 of package substrate 200, as shown in FIGS. 4A-4B, having unit devices spaced from one another by saw streets 401 running vertically (as oriented in FIG. 4C) and saw streets 403 running horizontally. Each of the devices has a die cavity 220 and trenches 222 that are adjacent to and spaced from the ends of the die cavity 220 and parallel to the ends of the die cavities. In an example process, tens, hundreds or thousands of devices can be processed contemporaneously on a panel 400, and then separated by sawing though the saw streets 401, 403 to form individual packaged semiconductor devices.

Figure 5A:
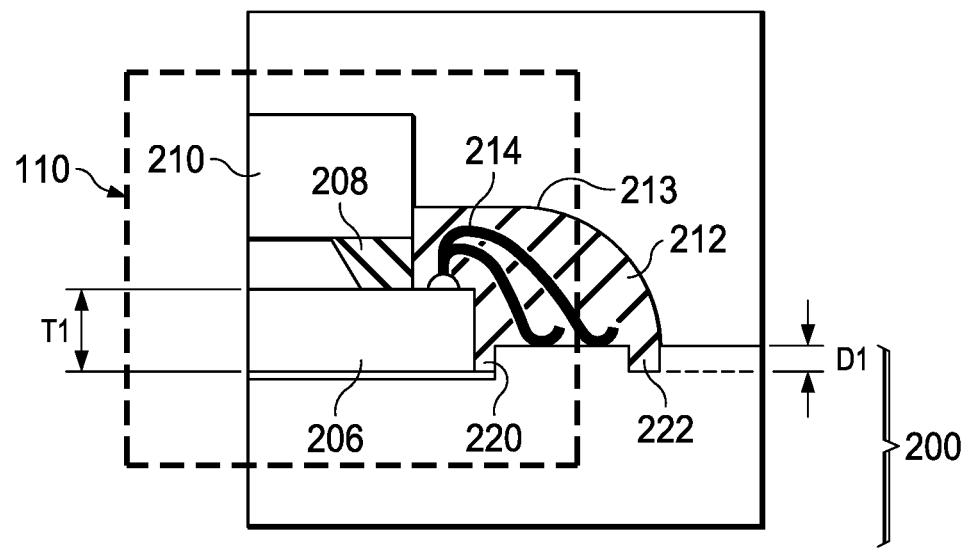
FIGS. 5A-5B illustrate, in partial cross sections, a first arrangement using a semiconductor substrate without thinning, and an additional arrangement formed using a semiconductor substrate that was thinned.
Figure 5B:
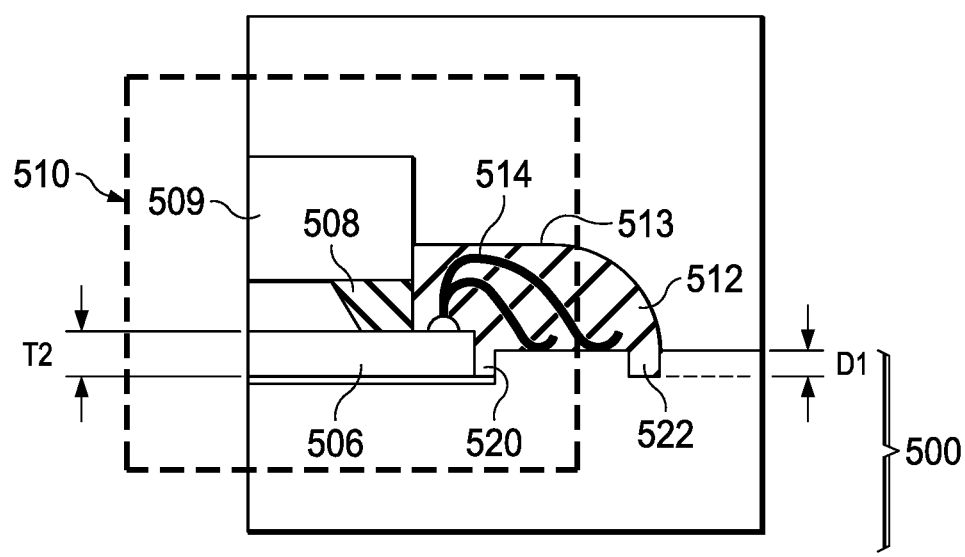

FIGS. 5A-5B illustrate, in partial cross sections, a comparison illustrating additional alternative approaches to form additional arrangements. In FIG. 5A, a partial cross section of the arrangement of FIG. 2D is shown, with a semiconductor die 206, an interposer 208 and a cover 210 forming the semiconductor device 110. As described above, the semiconductor device 110 is mounted in die cavity 220 to a substrate 200. Trench 222 acts as a dam or gutter when dielectric material 212 is dispensed, so the dielectric material 212 is contained between the semiconductor die 206 and the trench 222. The dielectric material 212 covers the conductors 214 and is cured to form a solid protective dielectric material with an upper surface 213. In a particular example, the semiconductor die 206 has a thickness T1 of about 750 microns.

An alternative arrangement is shown in FIG. 5B. In FIG. 5B, the package substrate 500 is similar to the package substrate 200 in FIG. 5A, with similar die cavity depth D1, the die cavity is 520, trenches 522 are spaced from the die cavity. In FIG. 5B, a semiconductor device 510 includes a semiconductor die 506 with a thickness T2. A cover 509 and an interposer 508 are used to form the semiconductor device 510. The package substrate 500 is similar to the package substrate 200 in FIG. 5A, the difference between the arrangements of FIGS. 5A and 5B is the thickness T2 of the semiconductor die 506. In a particular example, the thickness T2 is about 350 microns, or about one half of thickness T1 in FIG. 5A. This smaller die thickness is formed by performing a backgrinding operation on the semiconductor wafer (see for example FIG. 1A, wafer 101) during semiconductor fabrication of semiconductor die 506. By reducing the thickness of semiconductor die 506, the relative height of the semiconductor die 506 with respect to the package substrate 500 is reduced without changing the depth D1 of the die cavity 520. This reduced relative height also results in reducing the loop height of the conductors 514, bond wires in this example, and in reducing the volume of the dielectric material 512 when compared to 212 in FIG. 5A. The upper surface 513 of dielectric material 512 is lower than the upper surface 213 in FIG. 5A for dielectric material 212. By further reducing the volume of the dielectric material 512 in the arrangement of FIG. 5B, the arrangement further reduces the mechanical stress due to the CTE differences in the materials, reducing delamination. Additional arrangements can be formed by combining the thinned semiconductor die in the arrangement of FIG. 5B with the bond finger shelf cavities of FIGS. 3A-3D, and by changing the depth of the die cavities D1 so that the active surface of the semiconductor dies is in the same plane as the surface of the package substrate, or lies beneath the surface of the package substrate, to further reduce the bond wire loop heights, reducing the volume of the dielectric material, and reducing stress due to the dielectric material.

In the arrangements, the amount or volume of the dielectric material, which can be a glob top dielectric material, is reduced when compared to packaged devices formed without the arrangements. By using a die cavity in a package substrate and controlling the volume of the dielectric material, the mechanical stress on the semiconductor die and cover due to the dielectric material is reduced. In the arrangements, the die cavity is formed to a relatively shallow depth so that the overall thickness of the package substrate can be kept relatively small, reducing costs of the package substrate. The glob top material, and the cover, will be above the surface of the package substrate. The cavity depth in the package substrate will be less than, equal to, or slightly greater than the thickness of the semiconductor die, but is not deep enough to include the cover, so that the package substrate remains relatively thin, this reduces the cost of the package substrate.

Figure 6A:
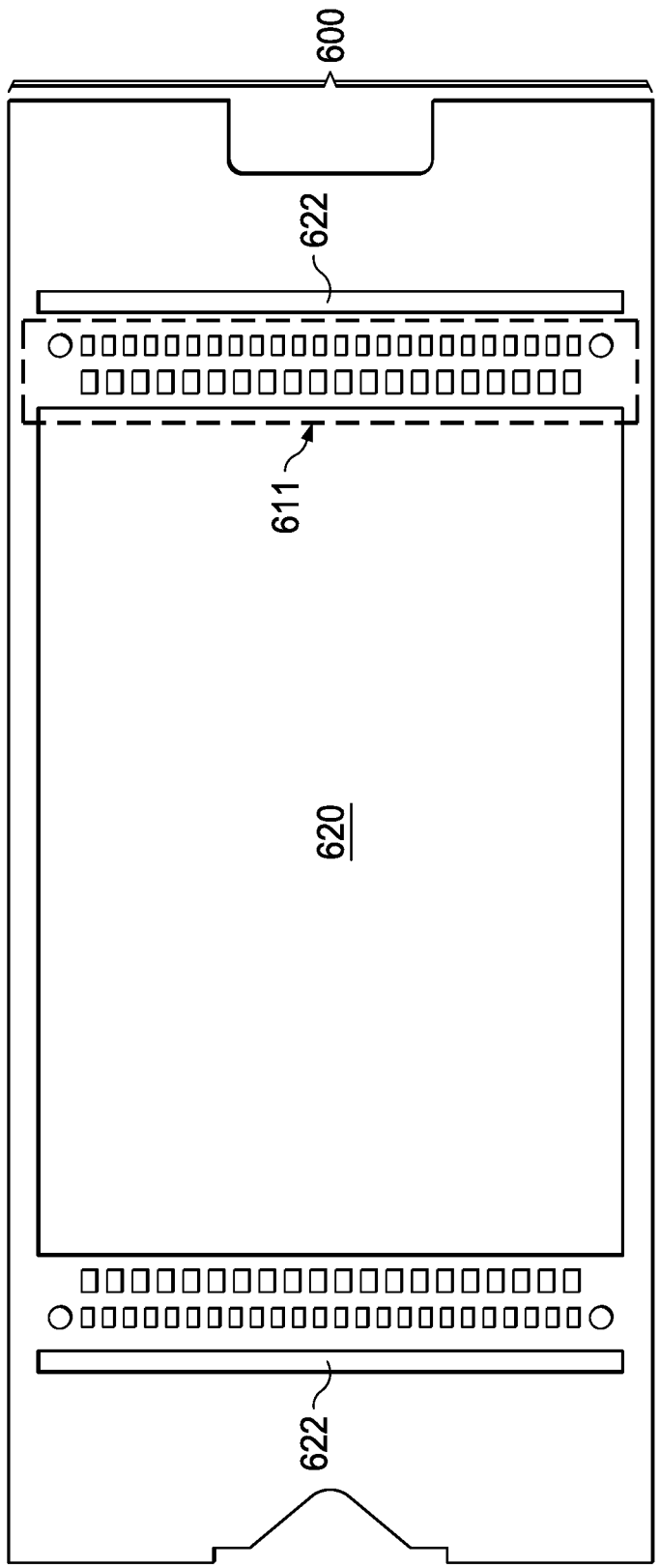
FIGS. 6A-6B illustrate, in a plan view and a partial cross section, respectively, details of an example package substrate for use with an arrangement.
Figure 6B:
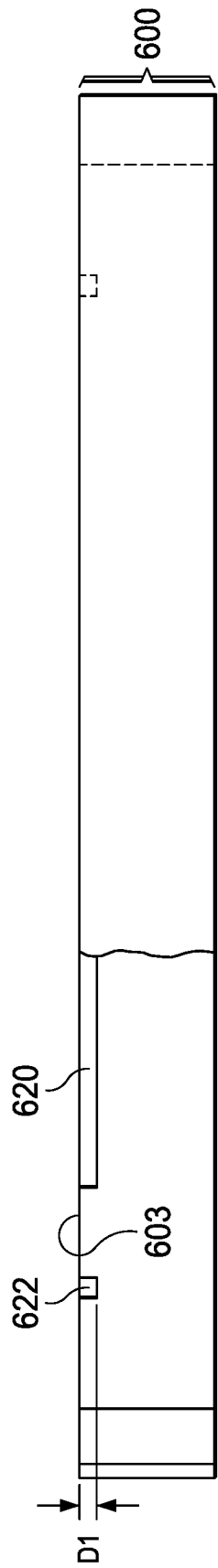

FIGS. 6A-6B are a detailed plan view and partial cross section, respectively, of a particular example apparatus, a package substrate 600 for use in the arrangements. The package substrate 600 in FIGS. 6A-6B uses the trenches 622 formed in a first package surface of package substrate 600 to contain the dielectric material, for example glob top mold compound, when it is dispensed, similar to arrangements of FIGS. 2A-2D. In FIG. 6A, a die cavity 620 is formed in the first package surface 603 of package substrate 600, and bond fingers 611 are formed on the first package surface 603 of the package substrate 600 between the trenches 622 and the ends of the die cavity 620. In a particular example, the package substrate 600 is a ceramic substrate with a thickness of about 1.8 millimeters+/−0.1 millimeters. The depth D1 of the die cavity 620 and the trenches 622 is about 0.25 millimeters+/−0.025 millimeters. The package substrate 600 can be a multiple layer ceramic substrate, and die cavity 620 and trenches 622 can be formed by forming openings in the uppermost layer when the package substrate 600 is manufactured. In an alternative approach the trenches 622 and die cavity 620 can be formed using chemical etch or mechanical drilling operations.

Figure 7A:
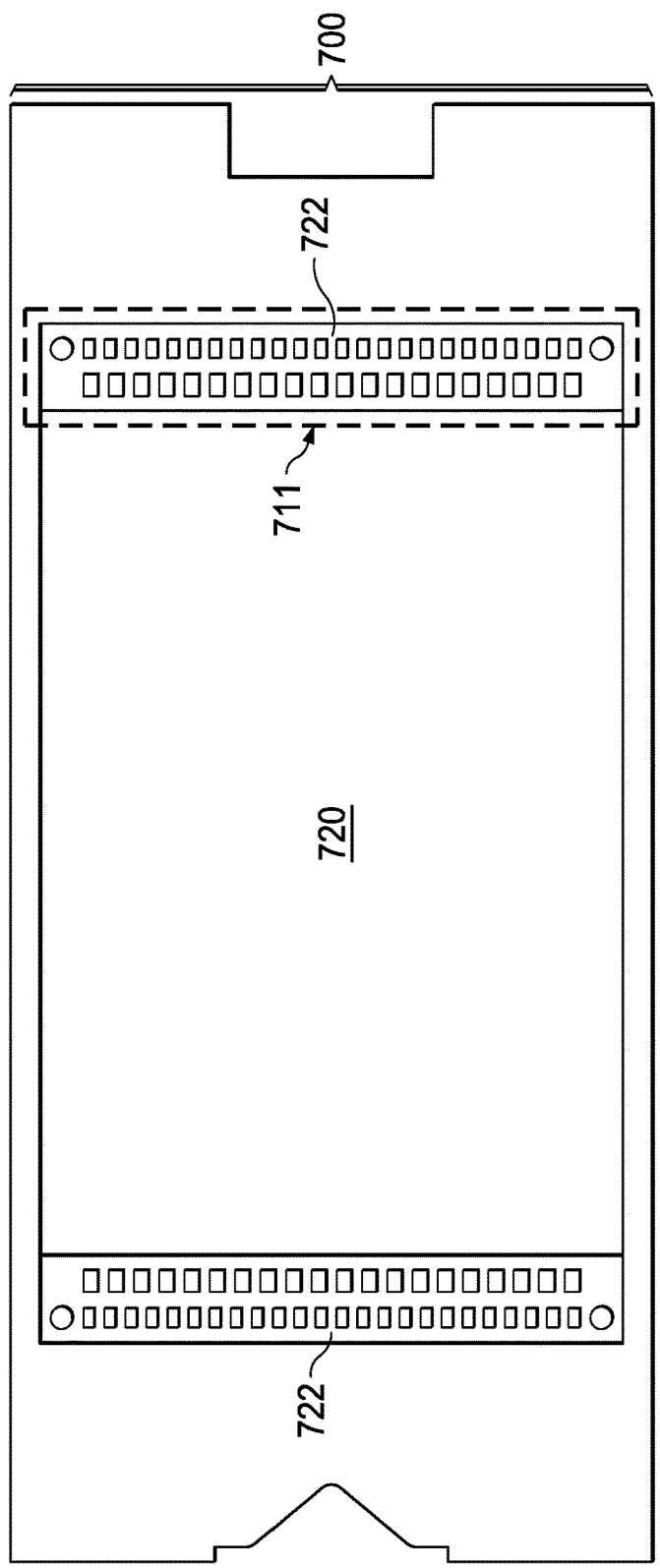
FIGS. 7A-7B illustrate, in a plan view and a partial cross section, respectively, details of an alternative example package substrate for use with an arrangement.
Figure 7B:
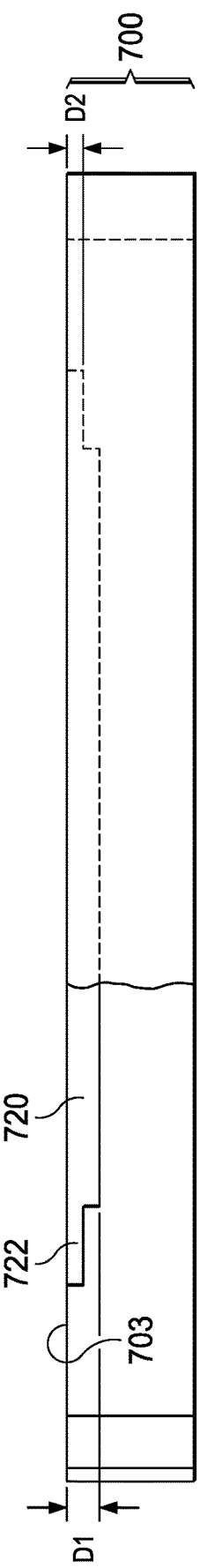

FIGS. 7A-7B illustrate, in a plan view and a partial cross section, additional details of a particular example for a package substrate of an arrangement. The arrangements of FIGS. 7A-7B are similar to the arrangement shown in FIGS. 3A-3D. The package substrate 700 includes a die cavity 720 and bond finger shelf cavities 722 extending into the first package surface 703, similar to the arrangement in FIG. 3A. FIG. 7A illustrates bond fingers 711 in the bond finger shelf cavities 722 at opposite ends of the die cavity 720. In a particular example, package substrate 700 has a thickness of about 1.78 millimeters+/−0.1 millimeters. The bond finger shelf cavities 722 have a depth D2 of about 0.25 millimeters+/−0.025 millimeters. The die cavity 720 has a depth D1 of about 0.5 millimeters+/−0.025 millimeters. The package substrate 700 is formed from a multilayer ceramic substrate. The die cavity 720 and the bond finger shelf cavities 722 can be formed by making openings in the uppermost layers of the ceramic substrate, or alternatively by chemical etch or mechanical drilling of the package substrate 700.

Figure 8:
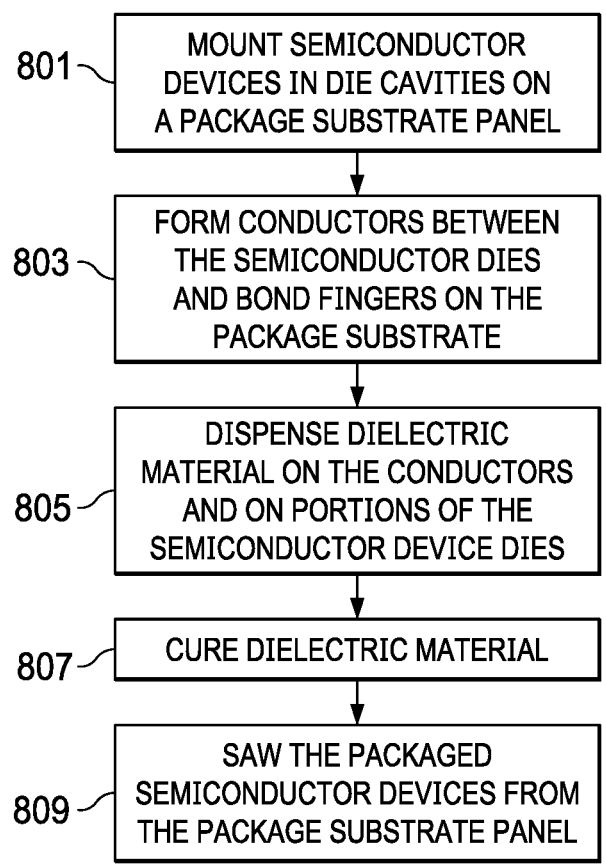
FIG. 8 illustrates, in a flow diagram, selected method steps for forming an arrangement.

FIG. 8 illustrates, in a flow diagram, selected steps of a method for forming an arrangement. At step 801, semiconductor devices are mounted in die cavities on a package substrate panel. In some examples the die cavities have a depth that is less than a thickness of a semiconductor die (see FIGS. 2A and 2B, semiconductor device 110, semiconductor die 206, and die cavity 220 with depth D1 that is less than die thickness T1.) In additional examples, the die cavity depth can be the same as the thickness of the semiconductor die, or can be greater than the thickness of the semiconductor die.

At step 803, the method continues by forming conductors between the semiconductor dies and bond fingers on the package substrate (see FIG. 2C, electrical conductors 214, on package substrate 200, bond fingers 611 are shown on package substrate 600 (see FIGS. 6A-6B).

At step 805, the dielectric material is dispensed on the conductors, and at step 807, the dielectric material is cured (see FIGS. 2C-2D, dielectric material 212).

At step 809, the packaged semiconductor devices are separated from the package substrate panel. (See FIG. 4C).

Figure 9:
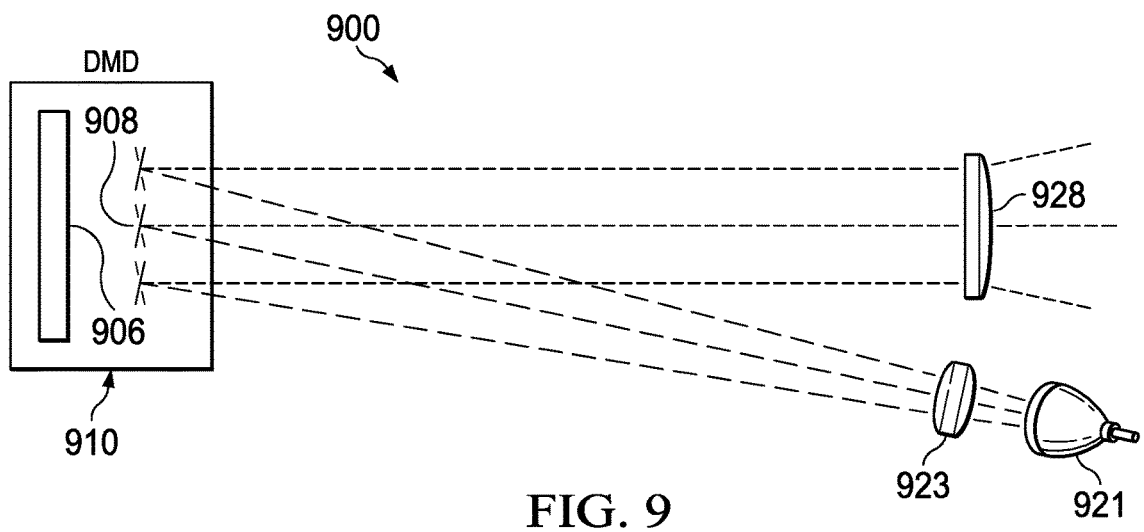
FIG. 9 illustrates in a block diagram a system including a packaged semiconductor device of an arrangement.

FIG. 9 illustrates in a block diagram an application for a packaged semiconductor device of the arrangements in an illumination system 900. Packaged semiconductor device 910 includes a semiconductor die 906, which in this example is a DMD. In this example, the semiconductor die 906 includes digital micromirrors 908 forming picture elements for projecting modulated light. In system 900, a light source 921 and illumination optics 923 direct light from the light source 921 onto the face of the micromirrors 908 within the packaged semiconductor device 910. In an example process the micromirrors 908 are formed of aluminum and are mounted on a hinged mechanism. The micromirrors 908 can be tilted using electronic signals applied to electrodes that control a tilt by pivoting the micromirrors about an axis. In an example DMD device, thousands and even millions of the micromirrors are formed in an array. When used in a projection application, individual micromirrors 908 are positioned to reflect the light from the illumination optics 923 to a projection lens 928 and as shown in FIG. 9, a beam of light is projected out of the system 900.

Figure 10:
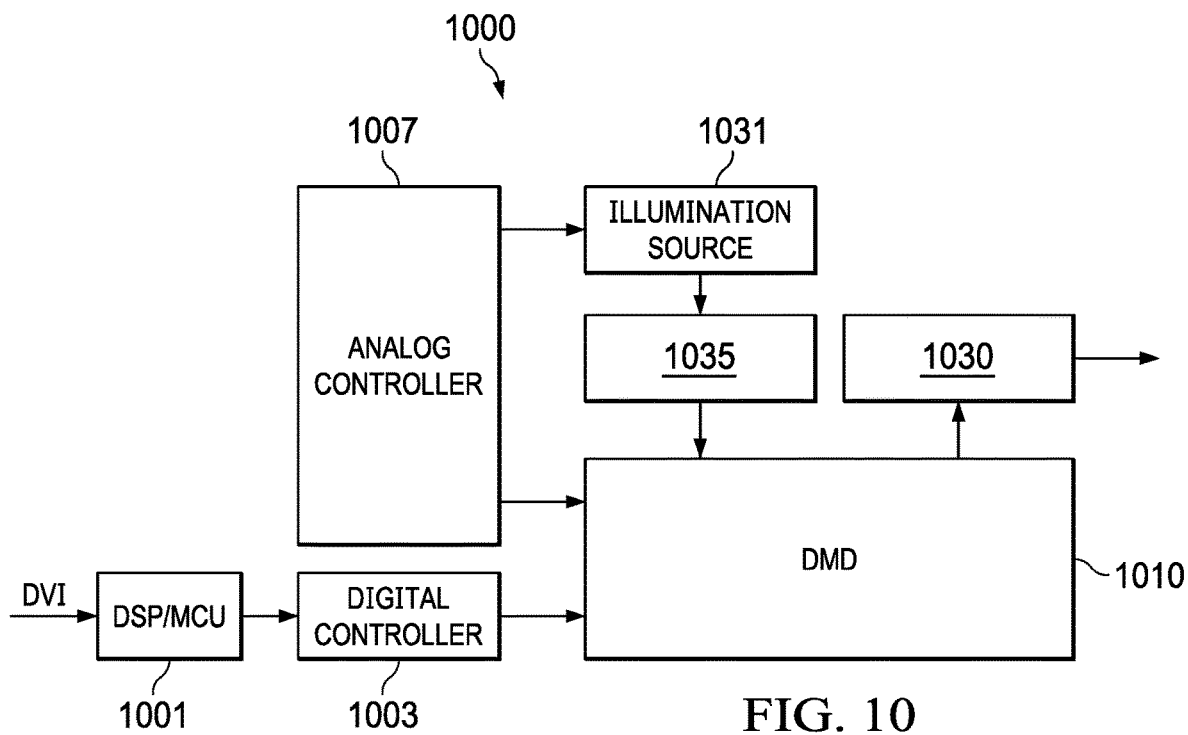
FIG. 10 illustrates in another block diagram a system including a packaged semiconductor device of an arrangement.

FIG. 10 illustrates in a block diagram of various elements of a system 1000 that uses a packaged semiconductor device of the arrangements. DMD 1010 is a packaged semiconductor device using one of the arrangements. A processor 1001, which can be implemented using a digital signal processor (DSP) or a microcontroller unit (MCU), receives digital video input (DVI) signals. A digital controller 1003 provides digital data to the DMD 1010, including frame data for display. Analog controller 1007 controls power signals to the DMD 1010, and to the illumination source 1031. Light from the illumination source 1031 is coupled to the DMD 1010 by illumination optics 1035. Modulated light from the DMD 1010 is then coupled to projection optics 1030, and the light is then output from system 1000. Illumination light is optically coupled to the DMD 1010. Projection optics 1030 couples modulated light reflected from the DMD 1010 to an output for the system 1000.

In the arrangements, a package substrate with a die cavity is used for a semiconductor device mounted to the package substrate. The use of the die cavity reduces the volume of dielectric mold compound used and reduces the amount of contact between a semiconductor die and the mold compound, the use of the arrangements reducing the volume of mold compound and reducing the corresponding mechanical strain. Problems with delamination observed during temperature cycling of prior devices are reduced or eliminated by use of the arrangements. In experiments, the mechanical strain observed due to the CTE differences in materials was reduced by about 50% when the packaged devices and package substrates of the arrangements were used (compared to a similar packaged device formed without the features of the arrangements.)

Although the example illustrative arrangements have been described in detail, it should be understood that various changes, substitutions and alterations can be made herein without departing from the spirit and scope of the present application as defined by the appended claims. Accordingly, the appended claims are intended to include within their scope processes, machines, manufacture, compositions of matter, means, methods, or steps that provide equivalents to the examples disclosed.

What is claimed is:

1. An apparatus, comprising:
  a substrate having a substrate surface, a cavity extending into the substrate surface, and a trench extending into the substrate surface, the trench spaced from the cavity;
  a die having bond pads on a first die surface and having a second die surface opposite the first die surface, the second die surface of the die in the cavity;
  a cover over at least a portion of the first die surface of the die;
  conductors coupling the bond pads of the die to conductive material on the substrate surface, the conductors between the cavity and the trench; and
  dielectric material over the conductors, wherein the dielectric material extends from the die to an edge of the trench.

2. The apparatus of claim 1, wherein the trench is a first trench parallel to a first end of the cavity, the substrate surface of the substrate further having a second trench parallel to a second end of the cavity, the conductive material on the substrate surface between the cavity and the first trench and between the cavity and the second trench.

3. The apparatus of claim 1, wherein the conductors are bond wires connected between the bond pads on the die and the conductive material on the substrate surface of the substrate.

4. The apparatus of claim 3, wherein the bond wires comprise gold, copper, palladium coated copper, silver, or aluminum.

5. The apparatus of claim 1, wherein the conductors are bond wires or ribbon bonds.

6. The apparatus of claim 1, wherein the cover comprises an optically transmissive window.

7. The apparatus of claim 6, wherein the cover is glass.

8. The apparatus of claim 1, wherein the die comprises a digital micromirror device (DMD).

9. The apparatus of claim 1, wherein the dielectric material comprises a mold compound.

10. The apparatus of claim 9, wherein the mold compound comprises a thermoset epoxy resin.

11. The apparatus of claim 1, wherein the dielectric material comprises a glob top material.

12. A packaged semiconductor device, comprising:
  a substrate having a substrate surface, the substrate having a cavity extending into the substrate surface, and the substrate having a trench spaced from the cavity and extending into the substrate surface;
  a die having a first surface and a second surface opposite the first surface, the die having bond pads on the first surface, the second surface in the cavity;
  a cover over at least a portion of the first surface of the die;
  conductors coupling the bond pads on the first surface of the die to conductive material on the substrate surface, the conductive material between the trench and the cavity; and dielectric material over the conductors and over the substrate surface from the die to an edge of the trench, the dielectric material having an upper surface that is above the substrate surface.

13. The packaged semiconductor device of claim 12, wherein the die comprises a spatial light modulator, a light emitting diode (LED) or laser diode, an imager, a photosensor, or a micro electro-mechanical system (MEMS) device.

14. The packaged semiconductor device of claim 12, wherein the die comprises a digital micromirror device (DMD).

15. The packaged semiconductor device of claim 14, wherein the dielectric material comprises a glob top dielectric material that is liquid or gel at room temperature.

16. The packaged semiconductor device of claim 12, wherein the substrate is a ceramic substrate.

17. The packaged semiconductor device of claim 12, wherein the substrate is a flame-retardant 4 (FR4) substrate or a bismaleimide triazine (BT) substrate.

18. An apparatus, comprising:
a substrate having a substrate surface, the substrate having a cavity extending into the substrate surface, trenches extending into the substrate surface, the trenches spaced from the cavity;
a die comprising a spatial light modulator, the die having an active surface and a backside surface opposite the active surface, the die having bond pads on the active surface and having the backside surface mounted in the cavity;
an optically transmissive window mounted over at least a portion of the active surface of the die;
bond wires coupling the bond pads to conductive material on the substrate surface, the conductive material spaced from the cavity, the conductive material on the substrate surface between the cavity and the trenches; and
dielectric material over the bond wires, the conductive material, and the bond pads, the dielectric material extending from the die to an edge of one of the trenches.

19. The apparatus of claim 18, wherein a thickness of the die is equal to a depth of the cavity.

20. The apparatus of claim 18, wherein a thickness of the die is less than a depth of the cavity.

* * * * *